(12) United States Patent
Yoshikawa et al.

(10) Patent No.: US 6,846,580 B2
(45) Date of Patent: Jan. 25, 2005

(54) ORGANIC LUMINOUS MATERIAL AND ORGANIC LIGHT-EMITTING DEVICE

(75) Inventors: Kota Yoshikawa, Kawasaki (JP); Masashi Kijima, Tsukuba (JP); Hideki Shirakawa, Yokohama (JP); Ikuo Kinoshita, Tsukuba (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/773,253

(22) Filed: Feb. 9, 2004

(65) Prior Publication Data

US 2004/0155577 A1 Aug. 12, 2004

Related U.S. Application Data

(62) Division of application No. 09/842,228, filed on Apr. 26, 2001, now abandoned.

(30) Foreign Application Priority Data

Apr. 27, 2000 (JP) .......................... 2000-128364
Sep. 22, 2000 (JP) .......................... 2000-288692
Apr. 24, 2001 (JP) .......................... 2001-125359

(51) Int. Cl.[7] .......................... H05B 33/14; C09K 11/06; C08G 61/00
(52) U.S. Cl. .......................... 428/690; 428/917; 313/504; 313/506; 252/301.16; 252/301.35; 257/40; 257/103; 526/285; 526/279; 528/32; 528/33; 528/43
(58) Field of Search .......................... 428/690, 917; 313/502, 504, 506; 252/301.16, 301.35; 257/40, 103; 526/285, 279; 528/32, 33, 43

(56) References Cited

U.S. PATENT DOCUMENTS 5,334,539 A  8/1994  Shinar et al. .................. 437/1
6,344,286 B1  2/2002  Kim et al. .................. 428/690

FOREIGN PATENT DOCUMENTS

JP  06-166743  6/1994
JP  10-326675  12/1998
WO  WO 99/57222  11/1999

OTHER PUBLICATIONS

"Processible poly[(p–phenyleneethylnylene)–alt–(2,5–thienyleneethylnylene)]s of high luminescence: their synthesis and physical properties", Pang et al., Journal of Materials Chemistry, 1998, 8(8), 1687–1690.

Optical Properties of Poly(2,5–dialkoxy–p–phenylenebutadiynylene), Japanese Journal of Applied Physics, Part 2: Letters, 38(A), L406–L409 (English), 1999.

*Primary Examiner*—Dawn Garrett
(74) *Attorney, Agent, or Firm*—Westerman, Hattori, Daniels & Adrian, LLP

(57) ABSTRACT

An organic EL device employing polymer material includes a structure in which a luminous layer formed of a polymer indicated by

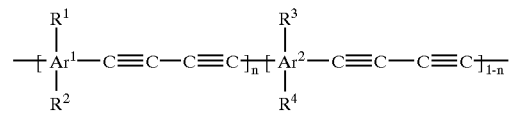

is put between a lower electrode and an upper electrode. Where, in the above chemical formula, $Ar^1$, $Ar^2$ denote a allylene group respectively, $R^1$, $R^2$, $R^3$, $R^4$ denote a substituent respectively, and n denotes a copolymerization ratio. Accordingly, the flatness of the luminous layer can be improved and the solubility of the luminous layer constituent material can be enhanced.

18 Claims, 5 Drawing Sheets

● n:(1-n)=2:1(26V)
✼ n:(1-n)=1:1(40V)

ORGANIC LUMINOUS MATERIAL AND ORGANIC LIGHT-EMITTING DEVICE

This application is a divisional of prior application Ser. No. 09/842,228, filed Apr. 26, 2001, now abandoned.

BACKGROUND OF THE INVENTION

1. Field of the Invention

The present invention relates to an organic luminous material and an organic light-emitting device and, more particularly, an organic luminous material and an organic light-emitting device like an organic electroluminescence (EL) device employing such material.

2. Description of the Prior Art

In recent years, the research and development of the organic EL device applied to the flat display panel, the mobile display device, etc. is vigorously pursued. The display device employing the organic EL device can provide the high brightness and full color display by the low voltage driving.

In addition, the display device consisting of the organic EL devices has features different from the liquid crystal display (LCD). For example, there can be provided the light weight and low cost product that has no viewing angle dependence because it is the spontaneously emissive display, does not need the back lights because of the high contrast, has a quick response speed, has the easy film formation characteristic, and stands the impact since the overall device is constructed by the solid state elements.

The organic EL device has a structure in which the lower electrode formed of transparent conductive material, the organic thin film (luminous layer), and the upper electrode formed of magnesium, potassium, etc. are formed in sequence on the glass substrate, for example, and a thickness of the overall structure can be reduced up to about several mm. Then, the light is emitted from the luminous layer by applying the DC voltage between the lower electrode and the upper electrode, and this light is passed through the lower electrode and the glass substrate to output to the outside. The organic EL device is the injection electroluminescence device that increases the number of carriers in operation by injecting the carriers from the electrode to thus emit the light by the recombination. Sometimes the organic EL device is also called the organic LED.

As the luminous material employed in the organic thin film of the organic EL device, there are the monomer material and the polymer material. Normally the film of the monomer material is formed by the vacuum evaporation method, and normally the film of the polymer material is formed by the coating method. The coating method is practical in device formation because the expensive equipment is not needed.

It is known that PPV (poly p-phenylenevinylene) is employed as the polymer material. The EL device employing such material is set forth in Patent Application Publication (KOKAI) Hei 10-326675, for example.

The conjugated polymer material such as PPV employed as the luminous layer in the prior art is in the high crystallinity state at the normal temperature, unlike the normal polymer material.

Accordingly, if such conjugated polymer material is formed on the substrate, unevenness is ready to occur on the surface of the luminous layer made of the polymer.

If the voltage is applied between the lower electrode and the upper electrode under the condition that the unevenness is present on the surface of the luminous layer, the electric field is ready to concentrate in the concave portion of the surface of the luminous layer. Thus, there is the possibility that the luminous layer is destroyed by the electric field, and then short-circuit between the lower electrode and the upper electrode is caused.

Also, since the luminous layer polymer in the prior art, which is ready to crystallize, is insoluble in the organic solvent, any treatment must be applied, e.g., the polymer must be mixed into the organic solvent while heating, when the polymer is coated on the substrate, and thus it is not easy to handle the polymer. In addition, even if the conjugated polymer in the prior art is solved in the organic solvent, such polymer is still ready to crystallize after the cooling.

SUMMARY OF THE INVENTION

It is an object of the present invention to provide a light-emitting device having a luminous layer formed of polymer material that can be planarized much more and has high solubility rather than a polymer material film in the prior art.

The above subjects can be overcome by an organic light-emitting device which comprises a lower electrode; a luminous layer formed on the lower electrode and made of polymer indicated by

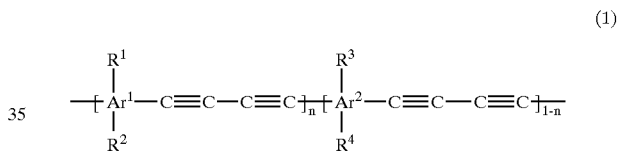

(1)

where $Ar^1$ denotes a first allylene group, $Ar^2$ denotes a second allylene group, $R^1$ denotes a first substituent, $R^2$ denotes a second substituent, $R^3$ denotes a third substituent, $R^4$ denotes a fourth substituent, and n denotes a copolymerization ratio; an upper electrode formed on the luminous layer. It is preferable that the n is set to $0 < n \leq 0.9$.

According to the present invention, the polymer employed as the luminous layer of the organic light-emitting device and given by the chemical formula (1) has low crystallinity at the normal temperature and the room temperature and has good solubility rater than the polymer for the luminous layer in the prior art.

Therefore, the polymer given by the chemical formula (1) is left as the flat film after such polymer is dissolved in the solvent, then this polymer is coated on the substrate, and then the solvent is removed.

As a result, if the organic light-emitting device is constructed by putting the polymer given by the chemical formula (1) between the upper electrode and the lower electrode, the local electric field concentration is hard to occur, the short-circuit between the upper electrode and the lower electrode is hard to occur, and the yield of the device can be improved.

If the first allylene group of the polymer is a paraphenylene group and the second allylene group is a metaphenylene group, and the polymer is given by (2)

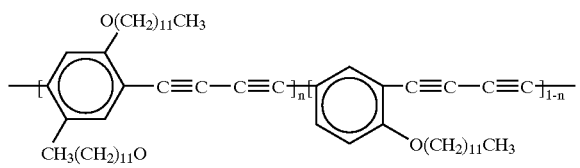

in the organic light-emitting device, difference in the luminous intensity of the luminous layer is caused according to the difference in the value n of the polymer given by the chemical formula (2) under the condition that the structures other than the luminous layer are formed identically. If the n is 0.66, or the n is a value to satisfy n:(1−n)=2:1, the highest luminous intensity can be achieved.

The chemical formula (2) shows the material that can emit the light in the green color wavelength band and its near emission wavelength band. In order to utilize the luminous material in the full color display device, the material that can emit the light in the red color wavelength band and its near emission wavelength band or the material that can emit the light in the blue color wavelength band and its near emission wavelength band is needed.

As such luminous material that emits the light in the red color luminous wavelength band and its near wavelength band, there is the organic luminous material given by (3)

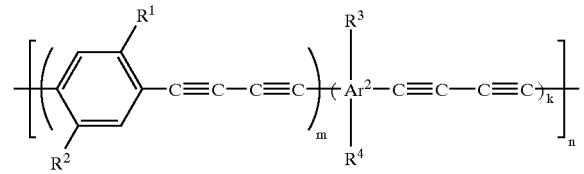

in which the benzene ring is utilized as the aromatic ring constituting the first allylene group in the chemical formula (1).

Where, in the chemical formula (3), $Ar^2$ denotes an allylene group, $R^1$ denotes a first substituent, $R^2$ denotes a second substituent, $R^3$ denotes a third substituent, $R^4$ denotes a fourth substituent, m and k denote copolymerization ratio, and n denotes a polymerization ratio. The aromatic ring constituting the allylene group consists of any one of thiophene, anthracene, pyridine, phenol, aniline, and each derivative of them. Also, the first substituent, the second substituent and the third substituent consist of any one of hydrogen atom, alkyl group, alkoxy group, carboxyl group, cyano group, phenyl group, biphenyl group, and cyclohexylphenyl group respectively.

Also, as the luminous material that emits the light in the red color wavelength band and its near emission wavelength band, there is the organic luminous material given by (4)

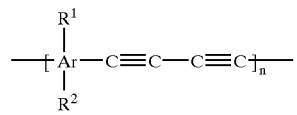

Where, in the chemical formula (4), Ar denotes an allylene group, $R^1$ denotes a first substituent, $R^2$ denotes a second substituent, and n denotes a polymerization ratio. The aromatic ring constituting the allylene group consists of any one of thiophene, anthracene, pyridine, phenol, aniline, and each derivative of them. Also, the substituent consists of any one of hydrogen atom, alkyl group, alkoxy group, carboxyl group, cyano group, phenyl group, biphenyl group, and cyclohexylphenyl group.

In addition, as the luminous material that can emit the light in the blue color wavelength band and its near emission wavelength band, there is the organic luminous material given by (5)

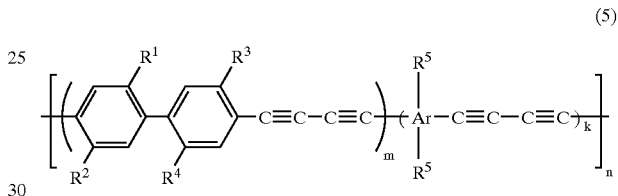

Where, in the chemical formula (5), Ar denotes an allylene group, $R^1$ denotes a first substituent, $R^2$ denotes a second substituent, $R^3$ denotes a third substituent, $R^4$ denotes a fourth substituent, $R^5$ denotes a fifth substituent, $R^6$ denotes a sixth substituent, m and k denotes copolymerization ratio, and n denotes polymerization ratio. The aromatic ring constituting the allylene group consists of any one of benzene, pyrrole, thiophene, carbazole, furan, fluorine, naphthalene, anthracene, and each derivative of them. Also, the first, second, third, fourth, fifth, and sixth substituents consist of any one of hydrogen atom, alkyl group, alkoxy group, carboxyl group, cyano group, phenyl group, biphenyl group, and cyclohexylphenyl group respectively.

Further, as the luminous material that can emit the light in the blue color wavelength band and its near emission wavelength band, there is the organic luminous material given by (6)

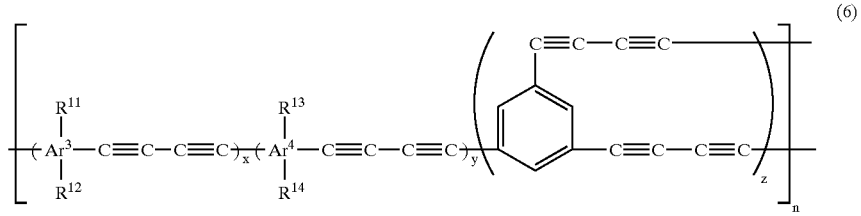

Where, in the chemical formula (6), $Ar^3$ denotes a first allylene group, $Ar^4$ denotes a second allylene group, $R^{11}$ denotes a first substituent, $R^{12}$ denotes a second substituent, $R^{13}$ denotes a third substituent, $R^{14}$ denotes a fourth substituent, x,y,z denote a copolymerization ratio respectively, and n denotes a polymerization ratio. The aromatic ring constituting the first allylene group and the second allylene group consists of any one of benzene, pyrrole, thiophene, carbazole, furan, fluorine, naphthalene, anthracene, and each derivative of them. Also, the first substituent, the second substituent, the third substituent, and the fourth substituent consist of any one of hydrogen atom, alkyl group, alkoxy group, carboxyl group, cyano group, phenyl group, biphenyl group, and cyclohexylphenyl group respectively.

DESCRIPTION OF THE PREFERRED EMBODIMENT

An embodiment of the present invention will be explained with reference to the accompanying drawings hereinafter.

FIGS. 1A to 1D are sectional views showing steps of manufacturing an organic EL device according to an embodiment of the present invention.

Figure 1A:
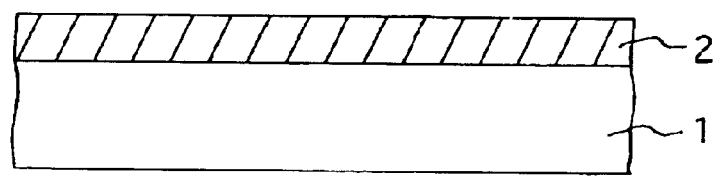
FIGS. 1A to 1D are sectional views showing steps of manufacturing an organic EL device according to an embodiment of the present invention.

In FIG. 1A, an ITO (indium tin oxide) film of 200 nm thickness is formed on a glass (transparent) substrate 1 as a lower electrode (anode) 2 by the sputter method. The ITO film is exposed to the oxygen, the ozone plasma, or the like to clean the surface.

The constituent material of the lower electrode 2 is not limited to ITO, transparent conductive materials such as IDIXO (indium zinc oxide) and others may be employed.

Then, the polymer given by a following chemical formula (7) is formed as a luminous layer 3 on the lower electrode 2 by the spin coating method to have a thickness of 150 nm, for example. For example, in the chemical formula (7), n=0.5.

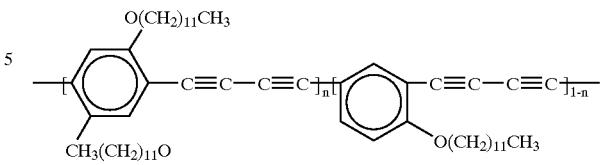

(7)

Figure 1B:
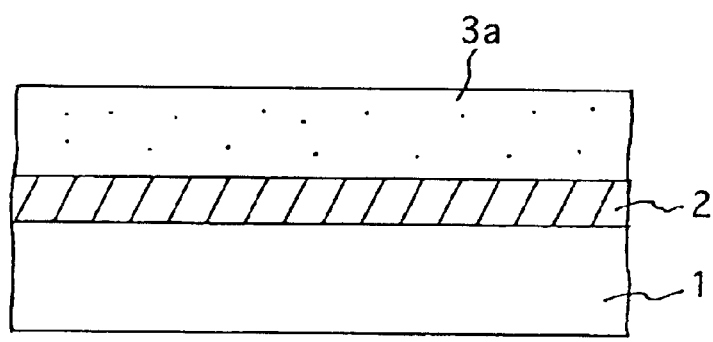

In the spin coating of the polymer, a solution is prepared by solving the polymer into the solvent, e.g., chloroform ($CHCl_3$) at the normal temperature. Then, as shown in FIG. 1B, the solution 3a is coated on the lower electrode 2, and then the solvent is removed by the drying. The drying temperature is set to more than the vaporization temperature of the solvent but less than 150° C. If the solvent is dried at 150° C., the drying time is set to about 30 minutes. The preferable drying conditions are the drying temperature of 90° C. and the drying time of 60 minutes.

Figure 1C:
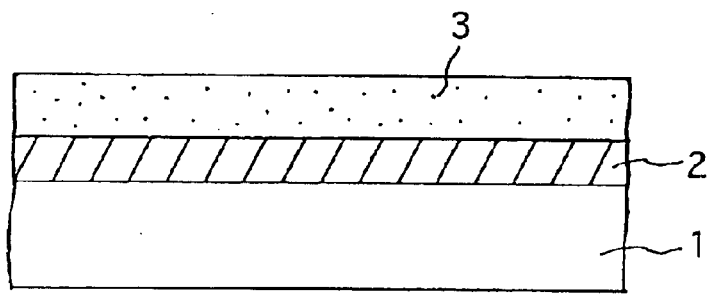

Accordingly, as shown in FIG. 1C, the polymer left on the lower electrode 2 and given by the chemical formula (7) is employed as the luminous layer 3.

Figure 1D:
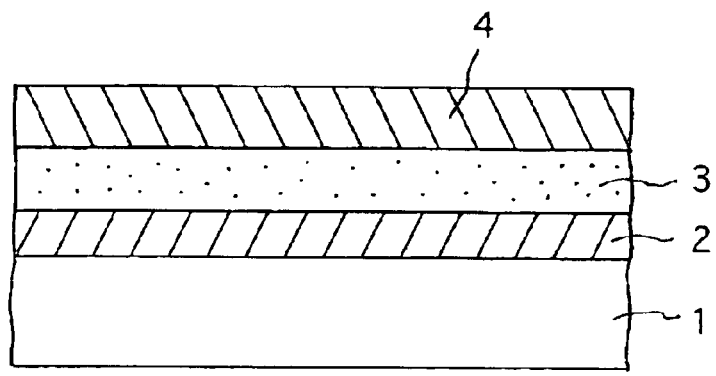

Then, as shown in FIG. 1D, a magnesium silver (MgAg) of 300 nm thickness is formed as an upper electrode (cathode) 4 on the luminous layer 3 by the co-evaporation method. This co-evaporation method used to form the magnesium silver is such a method that evaporation sources are arranged separately every constituent element in the evaporation chamber and then they are evaporated toward the same substrate to form the alloy. In this embodiment, the upper electrode 4 is formed of the MgAg film in which the magnesium and the sliver are alloyed at the rate of 1:10. In this case, the upper electrode 4 may be grown by the evaporation while patterning the upper electrode 4 by placing a metal mask between the evaporation sources and the substrate. In addition, as the material of the upper electrode 4, metals containing the alkaline metal or the alkaline earth metal such as Na, NaK, Mg, Li, CaMg/Cu mixture, Mg/In alloy, etc. may be employed.

In the light-emitting device formed by above steps, if the current is supplied by applying the voltage while setting the lower electrode 2 to the positive side and the upper electrode 4 to the negative side, the green light is emitted from the light-emitting device. Thus, the light is passed through the lower electrode 2 and the glass substrate 1 and then emitted to the outside.

In the above embodiment, since the polymer given by the chemical formula (7) has low crystallinity at the normal temperature and the room temperature and has good solubility in the solvent, the surface of the polymer left after the drying is flat rather than the prior art. Thus, the short-circuit between the upper electrode and the lower electrode can be prevented and yield of the device can be improved.

Figure 2:
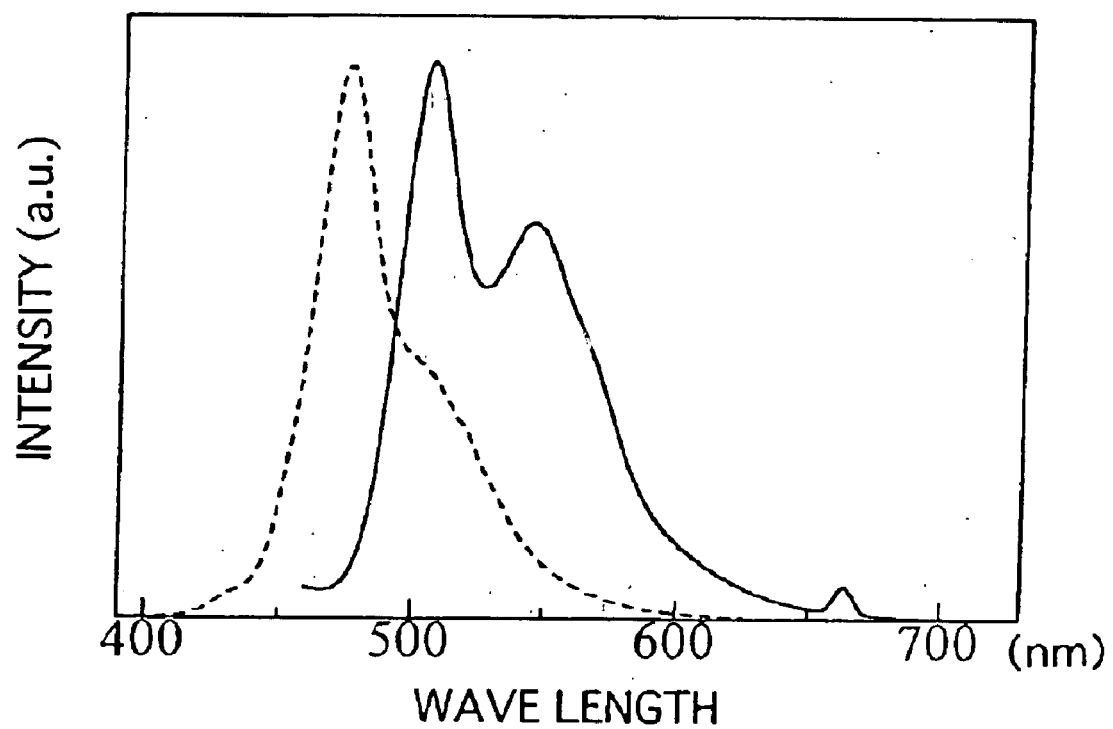
FIG. 2 is a graph showing a change of fluorescent spectrum of a luminous layer employed in the organic EL device in manufacturing process according to the first embodiment of the present invention.

The fluorescent spectrum in the state the polymer given by the chemical formula (7) is dissolved into the chloroform is a profile indicated by a broken line in FIG. 2, and the fluorescent spectrum of the polymer in the film state after the chloroform is removed is a profile indicated by a solid line in FIG. 2. In other words, it can be understood that the polymer in the film state can emit the light in the range of 500 to 550 nm.

Then, a method of synthesizing the polymer given by the chemical formula (7) will be explained hereunder.

First, the copper (I) chloride of 150 mg (1.5 mmol) and N,N,N',N'-tetramethylethylenediamine (TMEDA) of 180 mg (1.5 mmol) are added into the tetrahydrofuran (THF) solution of 180 mil liter (mL). Then, the catalyst is formed by supplying the oxygen into these mixtures for 10 minutes.

2,5-didodecyloxy-1,4-diethynylbenzene of 1.48 g (3 mmol) and 4-dodecyloxy-1,3-diethynylbenzene of 0.93 g (3 mmol) are dissolved into the tetrahydrofuran solution of 180 mL, and then this resultant solution is added into the THF solution containing the above catalyst. Then, substances in these mixtures are caused to react with each other in the oxygen atmosphere for two days. This reaction is the oxidative condensation polymerization reaction.

The 2,5-didodecyloxy-1,4-diethynylbenzene is indicated by a following chemical formula (8).

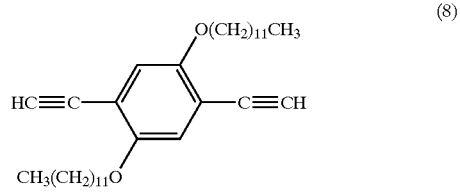

(8)

Also, the 4-dodecyloxy-1,3-diethynylbenzene is given by a following chemical equation (9).

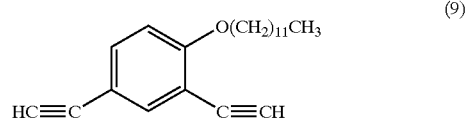

(9)

The THF reactive solution obtained by the oxidative condensation polymerization reaction is concentrated up to about 10 mL, and then the concentrate is dropped into the 1-liter 2N—HCL/MeOH solution that is hardly stirred. Then, the polymer generated by the oxidative condensation polymerization reaction is precipitated in the 2N—HCL/MeOH solution, then the catalyst is removed, and then the polymer is purified.

Then, the precipitated polymer is filtrated/recovered by using the glass filter, and then a small amount of polymer is dissolved once again in the THF solution of 10 mL, for example, and then the polymer is reprecipitated by dropping such polymer into a large amount, e.g., 1 liter, of MeOH liquid. The MeOH liquid is used in the situation that it is strongly stirred.

The product is refined by filtrating/recovering the reprecipitated polymer once again by using the glass filter. Then, the polymer is dried by the vacuum drying. The yield was 95%.

The reaction formula between the above 2,5-didodecyloxy-1,4-diethynylbenzene and the 4-dodecyloxy-1,3-diethynylbenzene is given as a following formula (10), and thus the polymer is obtained based on this reaction. In the reaction formula, "cat." denotes the catalyst. The copolymerization ratio of the polymer is given as x:y=1:1 similarly to the ratio of supply in the chemical formulae (7), (8) according to the yield, and thus the polymer in which n in the chemical formula (7) is 0.5 can be obtained.

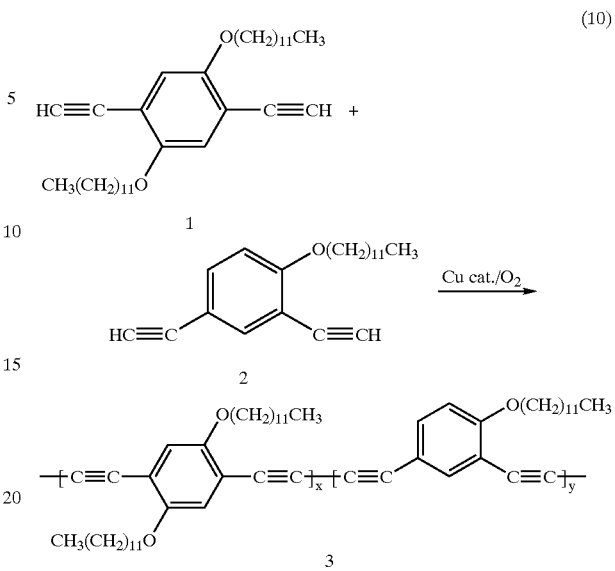

(10)

The polymer indicated by ③ in the reaction formula (10) is the structure representing the progress of synthesis, and is the same substance as the polymer in the chemical formula (7).

By the way, in the above example, the polymer given by the chemical formula (7) is employed as the luminous layer 3 of the organic EL device, but the general formula of the polymer can be given by a following chemical formula (11).

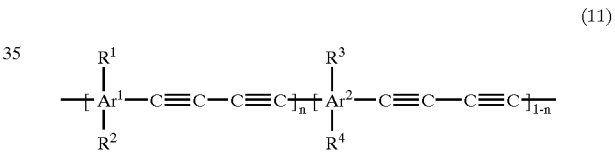

(11)

In the chemical formula (11), $Ar^1$, $Ar^2$ denote an allylene group (aromatic ring of two valence) respectively. As the aromatic ring constituting the allylene group, there are benzene, pyrrole, thiophene, carbazole, furan, fluorine, naphthalene, anthracene, and each derivative of them. The first unit which includes $Ar^1$ have two of triple bond of carbons, and the second unit which includes $Ar^2$ have two of triple bond of carbons.

As the allylene group, for example, there are biphenyl, terphenyl, perylene, coumalin, diphenylamine, triphenylamine, phenanthrene, phenanthridine, phenanthroline, phenylazobenzene, diphenylazobenzene, anthraquinone, acridinone, quinacridone, stilbenzene, and each derivative of them.

For example, as $Ar^1$, there is the allylene group such as 1,4-phenylene(para(p-)phenylene) group, 1,5 naphthalene group, ect., which has a structure to enhance the rigidity of the polymer. Also, as $Ar^2$, there is the allylene group such as 1,3-phenylene(meta(m-)phenylene) group, 1,2 naphthalene group, ect., which has a structure to reduce the rigidity of the polymer.

$R^1$, $R^2$, $R^3$, $R^4$ are a substituent such as hydrogen atom, alkyl group, alkoxy group, carboxyl group, cyano group, phenyl group, biphenyl group, cyclohexylphenyl group, and others respectively. Also, all $R^1$, $R^2$, $R^3$, $R^4$ are different kind, or some of them are same kind, or all of them are same kind.

An n in the chemical formula (11) is a copolymerization ratio and preferably n is set to 0<n≦0.9. As the polymer having n=1, for example, there is polyallylene butadienylene. In this case, it was confirmed that the crystallinity at the normal temperature is lowered rather than the prior art and the solubility is increased rather than the prior art.

The luminous wavelength at the luminous layer 3 is changed by selecting above $R^1$, $R^2$, $R^3$, $R^4$, $Ar^1$, $Ar^2$ appropriately. Accordingly, if the color image is needed, the pattern in which the structure of the polymer is changed every pixel of the image is formed.

In order to finely adjust the luminous color of the luminous layer 3, plural kinds of polymers may be contained.

Meanwhile, in the chemical formula (11), the first unit is defined as A and the second unit is defined as B. Then, if A, B have the structure given by the chemical formula (7) respectively, i.e., if the unit A has the structure of the para-substitution product and the unit B has the structure of the meta-substitution product, a relationship between the copolymerization ratio n of the polymer constituting the luminous layer 3 given by the chemical formula (7) and the luminous intensity of the luminous layer 3 was examined experimentally. As a result, it was found that, if the film thickness of the polymer and the forming steps are identical, the luminous intensity becomes different according to difference in the value of n. In the case of n=0.66 or n:(1-n)= 2:1, the luminous intensity of the luminous layer 3 was the highest.

Figure 3:
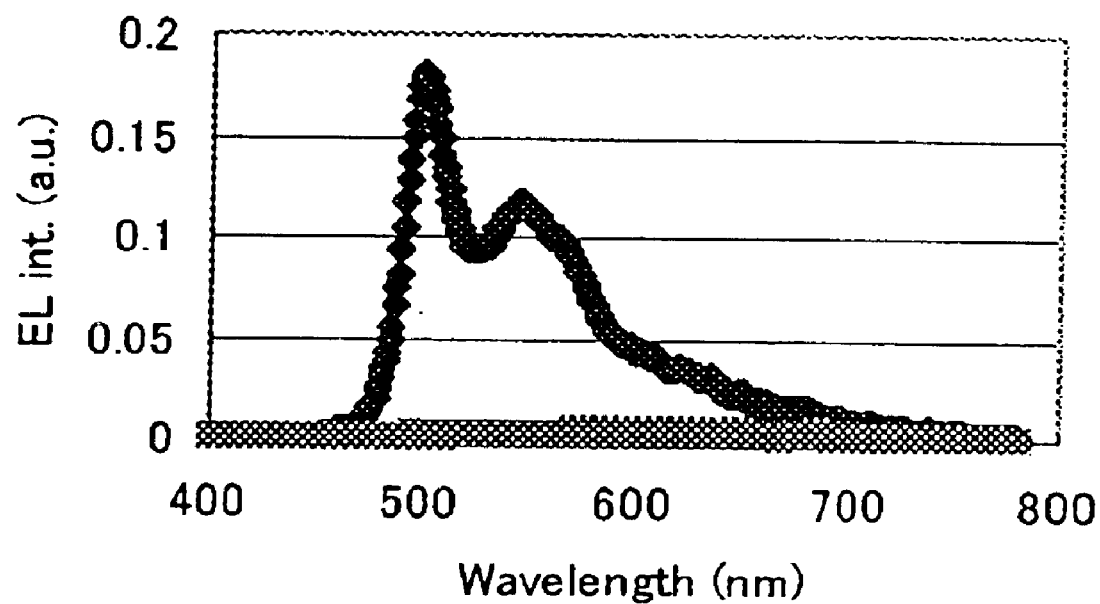
FIG. 3 is a graph showing an EL spectrum with respect to the luminous wavelength emitted by the luminous layer employed in the organic EL device according to the first embodiment of the present invention.

When the luminous intensity of the luminous layer 3 constructed by the polymer obtained when n:(1-n)=2:1 is set in the chemical formula (7) and the luminous intensity of the luminous layer 3 constructed by the polymer obtained when n:(1-n)=1:1 is set in the chemical formula (7) are compared with each other, an EL spectrum shown in FIG. 3 was derived. A profile showing the relationship between the luminous wavelength and the EL intensity is reflective of a profile of the fluorescent spectrum shown in FIG. 2.

In FIG. 3, the driving voltage of the luminous layer 3 formed of the polymer of n=0.5 is set to 40 V and the driving voltage of the luminous layer 3 formed of the polymer of n=0.66 is set to 26 V. Although there exists such difference in the driving voltage, the polymer of n=0.66 could provide the emission that is about 40 times as strong as the polymer of n=0.5.

In order to get n=0.66 in the chemical formula (7), i.e., to set x=2, y=1 in the chemical formula (10), the para-product of 2.96 g (6 mmol) indicated by a symbol ① in the chemical formula (10) and the meta-product of 0.93 g (3 mmol) indicated by a symbol ② in the chemical formula (10) as the ratio of supply are dissolved in the tetrahydrofuran solution to cause the oxidative condensation polymerization reaction. Then, like the case where the polymer of n=0.5 is formed, processes such as catalyst removal, polymer refinement, filtration/recovery, polymer reprecipitation, filtration/recovery, vacuum drying, etc. are carried out sequentially.

In the above organic EL device, the structure that outputs the light from the glass substrate side is employed. In contrast, the light may be output from the upper side by reversing the structure of the electrodes and forming the light transparent conductive film on the upper side. Also, in the above organic EL device, the structure in which the luminous layer is directly put between a pair of electrodes is shown. In this case, an organic electron transmitting layer may be formed between the luminous layer and the negative side electrode, otherwise an organic hole transmitting layer may be formed between the luminous layer and the positive side electrode.

In the meanwhile, the polymer given by the chemical formula (7) can emit the light in the emitting wavelength range of 500 to 550 nm, i.e., at the green color wavelength and its near emission wavelength.

For this reason, in order to display the full color image on the display device, the polymers that can emit the red color light and the blue color light are further required. Therefore, the polymer that can emit the light in the red color wavelength band will be explained hereunder.

First, the copolymerized polymer used as the red color luminous layer 3 is given by the chemical formula (12). In the copolymerized polymer in the chemical formula (12), an aromatic ring $Ar^1$ in the chemical formula (11) denotes a benzene ring, a substituent $R^4$ denotes the hydrogen atom, and $Ar^2$ denotes an allylene group, and the aromatic ring is any one of thiophene, anthracene, pyridine, phenol, aniline, and each derivative of them. In the chemical formula (12), $R^1$, $R^2$, $R^3$, and $R^4$ denote the substituent respectively, and are any one of hydrogen atom, alkyl group, alkoxy group, carboxyl group, cyano group, phenyl group, biphenyl group, and cyclohexylphenyl group respectively. And, m and k denote copolymerization ratio, and n denotes a polymerization ratio.

(12)

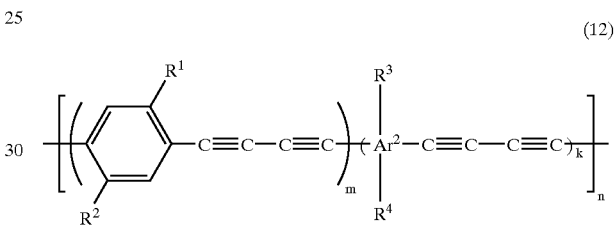

The polymer in which $R^1$, $R^2$ are the alkoxy group respectively, the aromatic ring constituting $Ar^2$ is thiophene, $R^3$ is the carboxyl group, and $R^4$ is hydrogen atom in the chemical formula (12) is called copoly(2,5-didodecyloxy-1,4-phenylenebutadiynylene)(3-dodecyloxycarbonylthienylenebutadiynylene)(2:1), and given by (13).

(13)

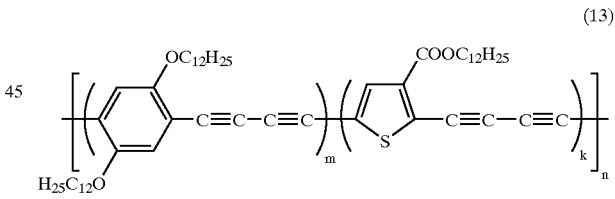

Figure 4:
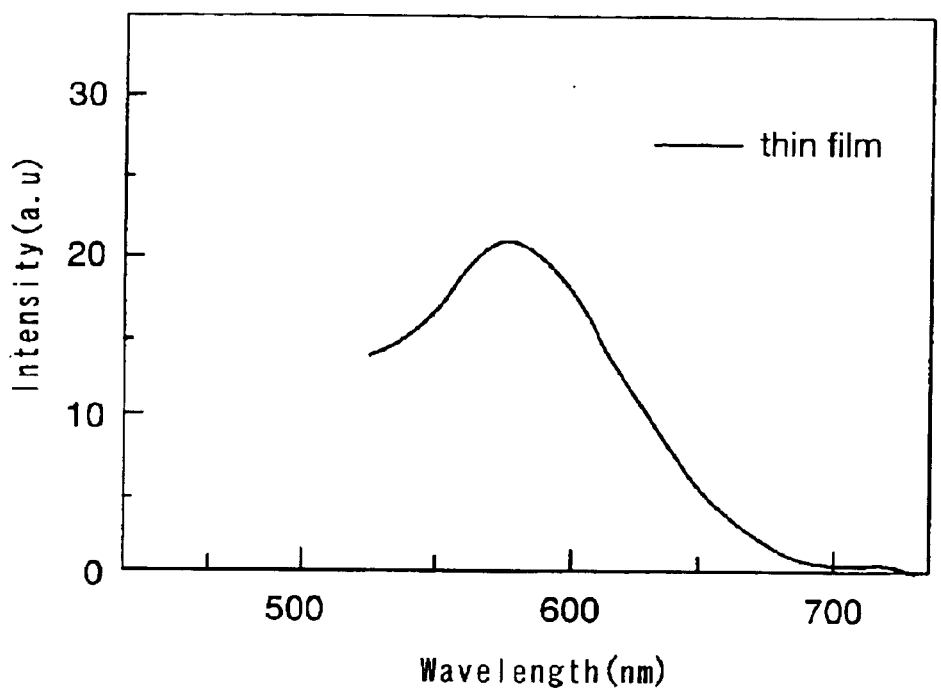
FIG. 4 is a graph showing a fluorescent spectrum of a red color luminous layer employed in the organic EL device according to the first embodiment of the present invention.

The luminous layer 3 formed of the copolymerized polymer given by the chemical formula (13) has the spectrum shown in FIG. 4, and the peak in the luminous wavelength band is 574 nm.

The polymer given by the chemical formula (13) can be synthesized in the same manner as mentioned above by using 3-dodecyloxycarbonyl-2,5-bis(trimethylsilylethynyl)thiophen instead of 4-dodecyloxy-1,3-diethynylbenzene shown in the chemical formula (9).

(Second Embodiment)

Figure 5:
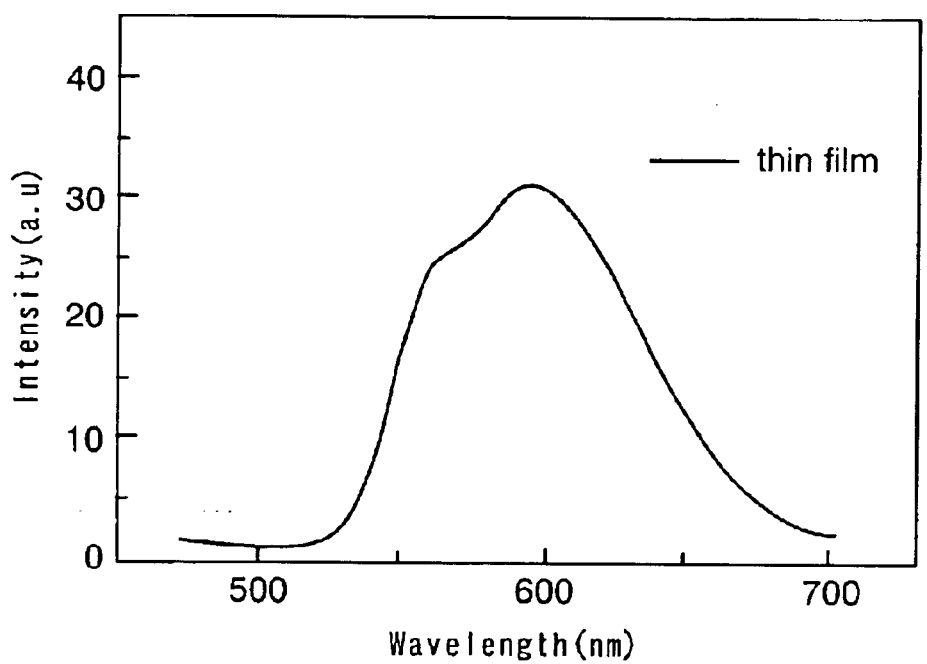
FIG. 5 is a graph showing a fluorescent spectrum of a red color luminous layer employed in the organic EL device according to the second embodiment of the present invention.

As the material constituting the red color luminous layer 3, homopolymer may be employed in place of the above copolymerized polymer. As the homopolymer, there is poly (3-dodecyloxycarbonyl-2,5-thienylenebutadiynylene) given by the chemical formula (14), for example. The spectrum of the homopolymer given by the chemical formula (13) is shown in FIG. 5, and has the peak at 596 nm in the luminous wavelength band.

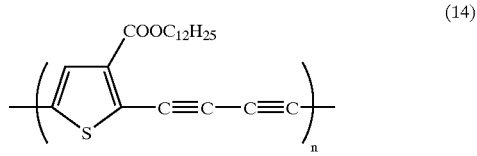
(14)

The homopolymer given by the chemical formula (14) can be synthesized as follows.

First, in the light-shielded argon atmosphere, 3-thenoic acid, called also as thiophenecarboxylic acid, of 5.12 g (40 mmol) is added to dimethylfolmamide (DMF) of 50 mL, and then N-bromosuccinimide of 14.6 g (82 mmol) is added to them.

Then, the reaction solution in which the reaction given by the chemical formula (15) by stirring them for a night is injected into a mixed solution of the saturated sodium sulfate liquid of 100 mL and the water of 600 mL, and then the resultant deposit is recovered. Then, the white needle-like crystal of 9.38 g can be obtained at the yield of 82.0% by recrystallizing the deposit in the ethanol/water mixed solution. The white needle-like crystal is the crystal of 2,5-dibromo-3-thenoic acid shown on the right side of the reaction formula (15).

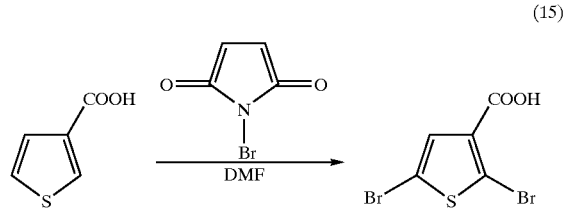
(15)

Then, dicyclohexylcarbodiimide (DCC) of 4.13 g (20 mmol) and dimethylaminopyridine (DMAP) of 2.44 g (20 mmol) are well vacuum-dried, and then dichloromethane ($CH^2Cl^2$) is added to the resultant mixture in the argon atmosphere. If 2,5-dibromo-3-thenoic acid of 5.72 g (20 mmol) and dodecanol ($C_{12}H_{25}OH$) of 3.73 g (20 mmol) are added to the resultant and then stirred for three days, the reaction showing in the reaction formula (16).

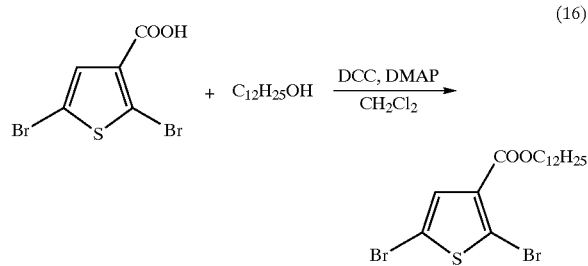
(16)

Then, the white crystal of 8.56 g (18.8 mmol) is obtained at the yield 94.2% by filtering the reaction salt, and then purifying the dichloromethane by using the silica gel column employed as the developing solvent. The white crystal is the crystal of 2,5-dibromo-3-dodecyloxycarbonnylthiophene, i.e., dodecyl2,5-dibromo-3-thenoate, shown on the right side of the chemical formula (16).

Then, 3-dodecylester-2,5-dibromothiophene of 6.81 g (15 mmol), copper iodide (CuI) of 103 mg (0.54 mmol), triph-enylphosphine ($PPh_3$) of 210 mg (0.8 mmol) are added into the mixed solution of triethylamine ($Et_3N$) of 27 mL and pyridine of 18 mL in the argon atmosphere. Then, this solution is stirred for twenty minutes while applying the argon-bubbling. Then, trimethylsilylacetylene (($CH_3$)$_3SiC\equiv C-H$) of 3.44 g (35 mmol) and bis(triphenylphosphine)palladium dichloride ($Pd(PPh_3)_2Cl_2$) of 105 mg (0.15 mmol) are added into the resultant solution. Then, this solution is stirred for a night while holding at 85° C., and then the extraction is executed by using dichloromethane and the water. The yellow oil of 5.93 g (11.8 mmol) is obtained at the yield of 78.9% by purifying the resultant oil layer by virtue of the silica gel column using the developing solvent that contains dichloromethane and hexane at a rate of 1:3 respectively.

The yellow oil is 3-dodecyloxycarbonyl-2,5-bis(trimethylsilylethynyl)thiophene, i.e., dodecyl-2,5-bis(trimethlsilylethynyl)-3-thenoate, that is obtained by the reaction given by the reaction formula (17).

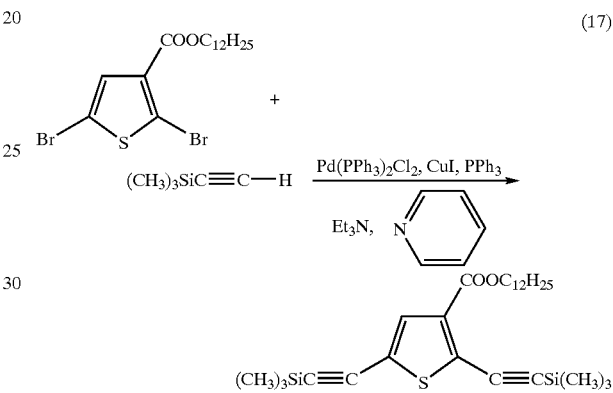
(17)

Then, the yellow oil of 0.500 g (1 mmol) is dissolved into THF of 20 mL and then 1M tetrabutylammonium fluoride ($Bu_4NF$) of 0.5 mL (0.5 mmol) in another THF is added. Then, this solution is stirred for five minutes, and then the purified product is obtained by purifying THF by virtue of the silica gel column used as the developing solvent. Then, the catalyst solution is formed by adding copper (I) chloride of 10 mg (0.1 mmol), N,N,N',N'-tetramethylethylenediamine (TMEDA) of 12 mg (0.1 mmol), THF of 8 mL, and pyridine of 2 mL into another vessel, and then supplying oxygen into the liquid in this vessel. Then, THF of 10 mL containing the above purified product is added in the catalyst solution, and then the reaction given by the reaction formula (18) is generated by stirring this for two days in the oxygen atmosphere.

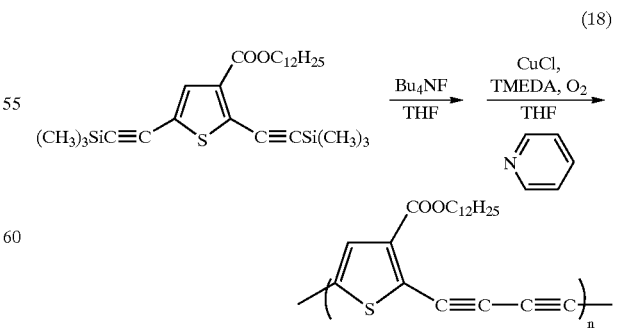
(18)

After this, the solution in which the reaction is generated is dropped into 2-normal (N) methanol hydrochloride of 500 mL, and then the resultant precipitate is recovered. Then, the red powder of 203 g (0.59 mmol) is obtained at the yield of 59.5% by dissolving this precipitate into chloroform, then dropping this liquid into the methanol of 500 mL, and then recovering the resultant precipitate. This red powder is substance on the right side of the chemical formula (18), i.e., the homopolymer given by the chemical formula (14).

The general formula of the homopolymer, that can emit the light in the red color wavelength band and its near emission wavelength band, according to the present embodiment is given by the chemical formula (19). In the chemical formula (19), the aromatic ring constituting Ar is any one of thiophene, anthracene, pyridine, phenol, aniline, and each derivative of them. $R^1$ denotes a first substituent, $R^2$ denotes a second substituent. The first substituent and second substituent consist of any one of hydrogen atom, alkyl group, alkoxyl group, carboxyl group, cyano group, phenyl group, biphenyl group, and cyclohexylphenyl group respectively. And, n denotes a poly

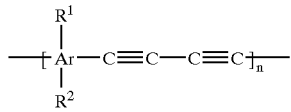

(19)

(Third Embodiment)

In the first and second embodiments, the polymer that can emit the light in the green color wavelength band and its near emission wavelength band or in the red color wavelength band and its near emission wavelength band is explained. In order to display the full color image on the organic EL display device, the polymer that can emit the blue color light is further required. Therefore, the polymer that can emit the light in the blue color wavelength band will be explained hereunder.

Figure 6:
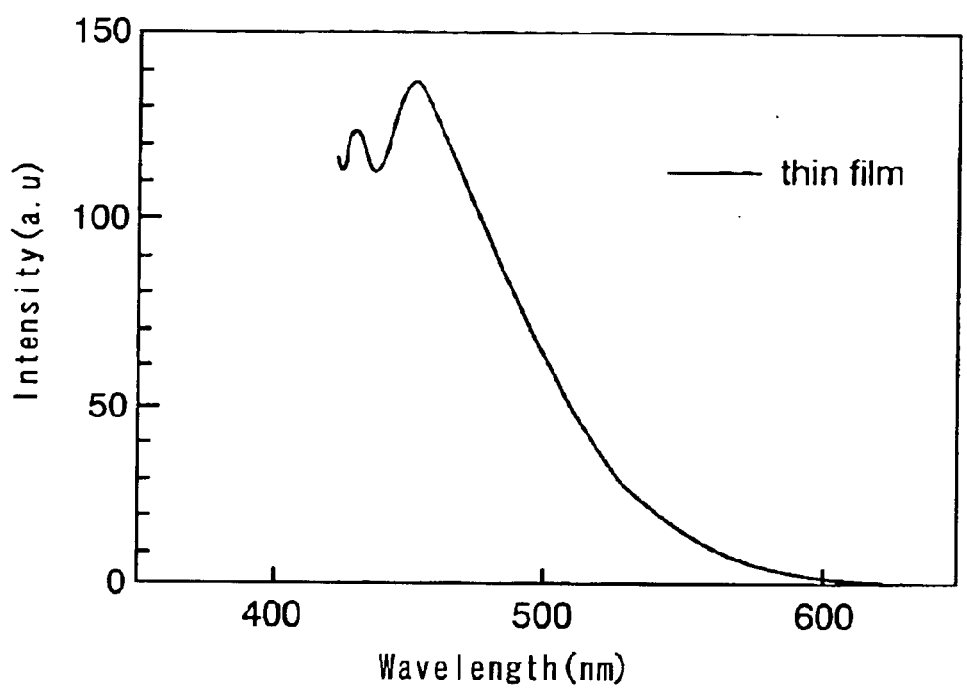
FIG. 6 is a graph showing a fluorescent spectrum of a blue color luminous layer employed in the organic EL device according to the third embodiment of the present invention.

As the copolymerized polymer constituting the blue color luminous layer 3, for example, there is copoly(4,4'-biphenylylenebutadiynylene)(4-dodecyloxy-m-phenylenebutadiynylene) as given by the chemical formula (20). The spectrum of the polymer given by the chemical formula (20) is shown in FIG. 6 and has peaks at 428 nm and 450 nm in the luminous wavelength band.

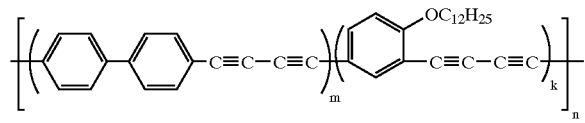

(20)

The polymer given by the chemical formula (20) is synthesized as follows.

First, 4,4'-bis(trimethylsilylethynyl)biphenyl is synthesized based on the reaction given by the reaction formula (21).

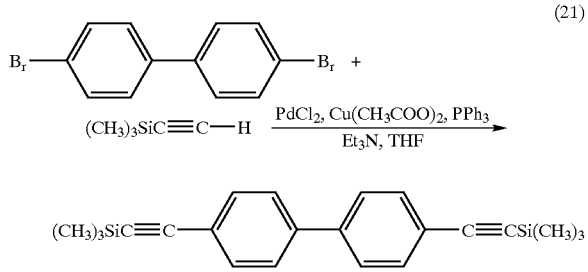

(21)

More particularly, the reaction in the chemical formula (21) is caused by adding 4,4'-dibromobiphenyl of 6.24 g (20 mmol), palladium chloride of 354 mg (2 mmol), copper acetate (Cu(CH$_3$COO)$_2$) of 364 mg (2 mmol), triphenylphosphine of 1.73 g (6.6 mmol), and trimethylsilylacetylene of 3.24 g (3.3 mmol) into the liquid, that contains triethylamine of 100 mL and THF of 130 mL, in the argon atmosphere, and then refluxing this liquid at 85° C. for a night. Then, the white plate-like crystal of 5.90 g (17 mmol) is obtained at the yield of 85.0% by extracting the liquid by the dichloromethane and the water, then processing the resultant oil layer by the silica gel column chromatography using the dichloromethane developing solvent, and then purifying the oil based on the recrystallization using the methanol. This white plate-like crystal is 4'-bis(trimethylsilylethynyl)biphenyl shown on the right side of the chemical formula (21).

Then, 4,4'-diethylbiphenyl is synthesized based on the reaction given by the reaction formula (22) by employing the white plate-like crystal.

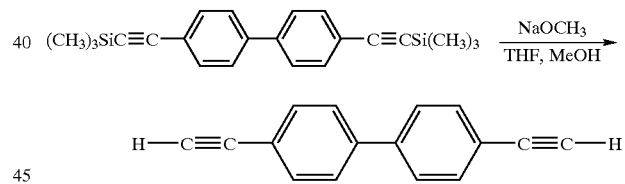

(22)

In other words, the white plate-like crystal of 5.9 g (17 mmol) is dissolved into the THF of 10 mL, then sodium methoxide (NaOCH$_3$) of 1.83 g (34 mmol) that is dissolved in the methanol (CH$_3$OH; MeOH) of 6 mL is added into this solution, and then they are reacted at a room temperature for three hours. Then, the oil layer is obtained by the extraction using dichloromethane and 10% hydrochloric acid aqueous solution.

The oil layer is purified by the silica gel column employing the developing solvent that contains dichloromethane and hexane at a rate of 1:1, whereby the white powder of 1.20 g (5.9 mmol) is obtained at the yield of 34.8%. This white powder is 4,4'-diethylbiphenyl shown on the right side of the chemical formula (22).

Then, copoly((4,4'-biphenylenebutadiynylene)(4-dodecyloxy-m-phenylenebutadiynylene)) is synthesized based on the reaction given by the reaction formula (23) using the white powder.

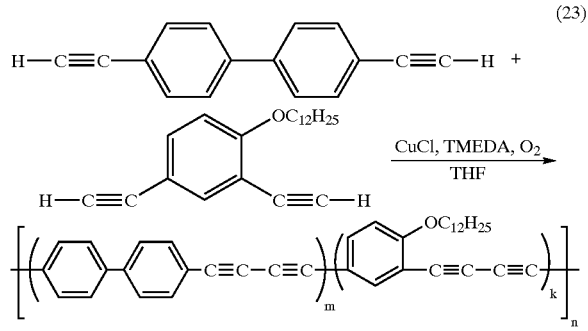

(23)

More particularly, the catalyst solution is formed by putting copper (I) chloride of 20 mg (0.2 mmol), TMEDA of 24 mg (0.2 mmol), and THF of 40 mL into the vessel to react with each other, and then supplying oxygen into this reaction solution. Then, 4,4'-diethylbiphenyl of 24 mg and 4-dodecyloxy-m-diethynylbenzene of 311 mg (1 mmol), that are dissolved in THF of 40 mL, are added to the catalyst solution respectively, and then they are stirred in the oxygen atmosphere for two days. This 4-dodecyloxy-m-diethynylbenzene is expressed by the second chemical structural formula from the left in the chemical formula (23). The reaction given by the chemical formula (23) makes progress in the middle of this stirring, then the resultant reaction solution is dropped into 2-normal methanol hydrochloride of 500 mL, and then the resultant precipitate is recovered. Then, this precipitate is dissolved into the chloroform to remove the insoluble component, then this solution is dropped into methanol of 500 mL, and then the resultant precipitate is recovered, whereby the white powder of 248 g (0.98 mmol) is obtained at the yield of 48.7%. This white powder is the polymer given by the chemical formula (20). When this polymer is employed as the luminous layer 3 like the first embodiment, the luminous layer 3 can emit the blue light or the light close to the blue.

The general formula of the polymer given by the chemical formula (20) is expressed by the chemical

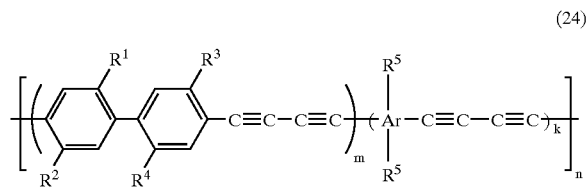

(24)

In the chemical formula (24), Ar denotes an allylene group that is any one of benzene, pyrrole, thiophene, carbazole, furan, fluorine, naphthalene, anthracene or each derivative of them. Also, $R^1$ is the first substituent, $R^2$ is the second substituent, $R^3$ is the third substituent, $R^4$ is the fourth substituent, $R^5$ is the fifth substituent and $R^6$ is the sixth substituent which consists of any one of hydrogen atom, alkyl group, alkoxyl group, carboxyl group, cyano group, phenyl group, biphenyl group, and cyclohexylphenyl group respectively. And, m and k denote co-polymerization ratio, and n denotes a polymerization ratio.

(Fourth Embodiment)

The polymer for emitting the blue color light, that is different from the polymer shown in the third embodiment, will be explained hereunder.

Figure 7:
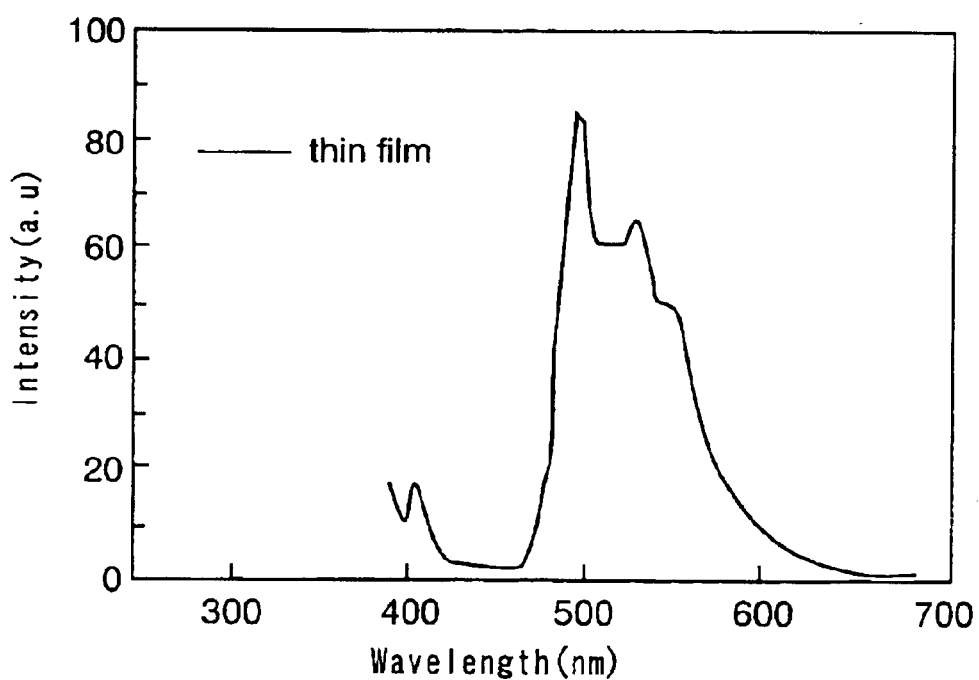
FIG. 7 is a graph showing a fluorescent spectrum of a blue color luminous layer employed in the organic EL device according to the fourth embodiment of the present invention.

As the copolymerized polymer constituting the blue color luminous layer, there is the structure given by the chemical formula (25), for example. The spectrum of the polymer given by the chemical formula (25) is shown in FIG. 7 and has peaks at 405 nm, 495 nm, and 512 nm in the luminous wavelength band. In the chemical formula, x:y:z is 6:3:1.

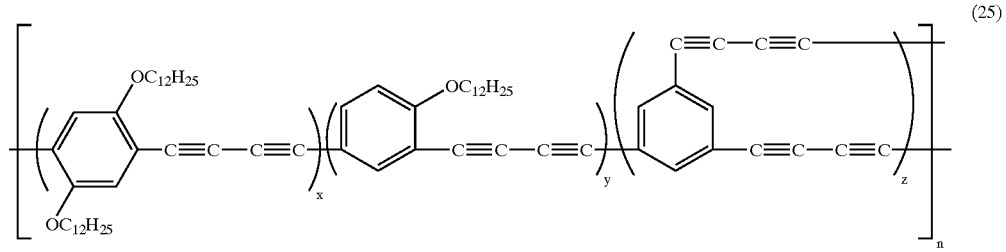

(25)

The polymer given by the chemical formula (25) is synthesized as follows.

First, the catalyst solution is formed by supplying oxygen into the reaction solution in which copper (I) chloride of 10 mg (0.1 mmol), TMEDA of 12 mg (0.1 mmol), and THF of 20 mL are mixed. Then, 2,5-didodecyloxy-p-diethynylbenzene of 297 mg (0.6 mmol), 4-dodecyloxy-m-diethynylbenzene of 93 mg (0.3 mmol), and 1,3,5-triethynylbenzene of 15 mg (0.1 mmol) are added into THF of 20 mL, then this solution is added to the above catalyst solution, and then the resultant solution is stirred in the oxygen atmosphere for two days. Accordingly, the reaction given by the reaction formula (26) is generated.

Then, the reaction solution is dropped into 2-normal methanol hydrochloride of 500 mL, and then the resultant precipitate is recovered. Then, this precipitate is dissolved into the chloroform, then this solution from which the insoluble component is removed is dropped into methanol of 500 mL, and then the resultant precipitate is recovered, whereby the yellow powder of 304 g is obtained at the yield of 75.4%.

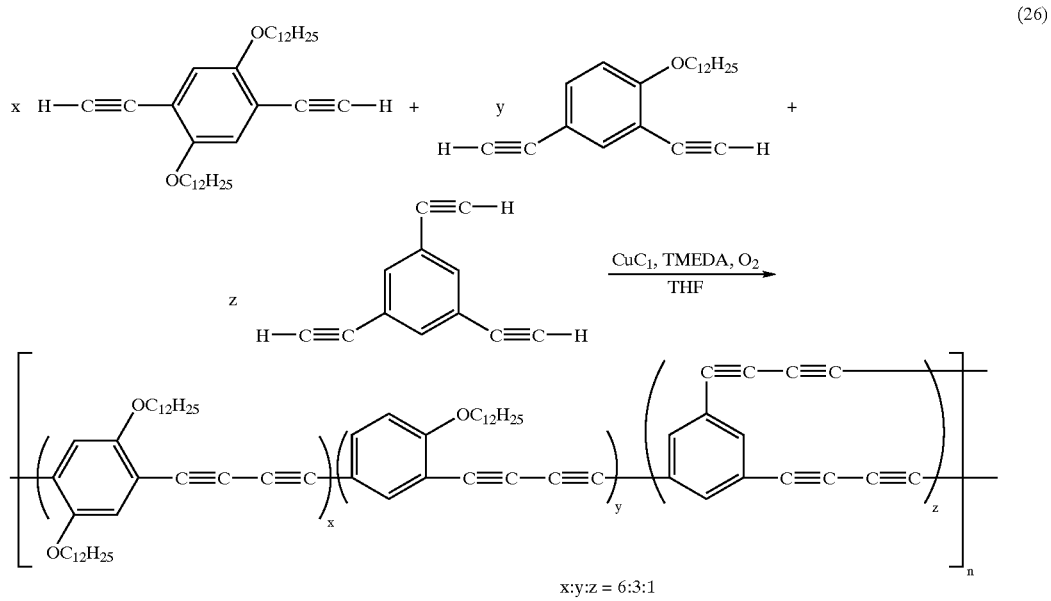

(26)

The general formula of the copolymerized polymer according to the present embodiment, that emits the light in the blue color wavelength band and its near emission wavelength band, is expressed by the chemical formula (27). In the chemical formula (27), $Ar^3$ and $Ar^4$ denote an allylene group (dihydric aromatic ring) respectively. As the aromatic ring constituting the allylene group, there are benzene, pyrrole, thiophene, carbazole, furan, fluorine, naphthalene, anthracene or each derivative of them.

layer in the prior art, such polymer is hard to crystallize at the normal temperature and has the high solubility in the solvent.

Accordingly, if one of these polymers is employed as the luminous layer, the planarization of the luminous layer can be facilitated, the short-circuit between the upper electrode and the lower electrode hardly occurs, and the yield of the device can be improved.

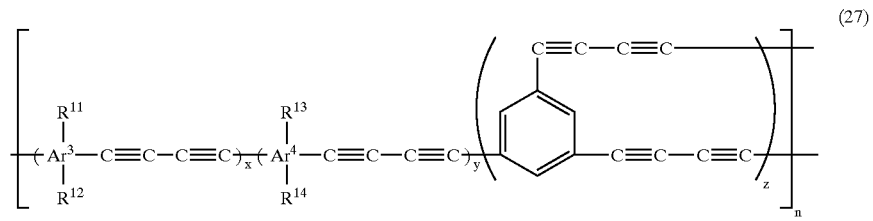

(27)

As the allylene group, for example, there are biphenyl, terphenyl, perylene, coumalin, diphenylamine, triphenylamine, phenanthrene, phenanthridine, phenanthroline, phenylazobenzene, anthraquinone, acridinone, quinacridone, stilbenzene and each derivative of them.

Also, $R^{11}$, $R^{12}$, $R^{13}$, $R^{14}$ are the substituent respectively, which consists of any one of hydrogen atom, alkyl group, alkoxy group, carboxyl group, cyano group, phenyl group, biphenyl group, cyclohexylphenyl group, and others. In addition, $R^{11}$, $R^{12}$, $R^{13}$, $R^{14}$ are all different types, or some of them are the same types, or $R^{11}$, $R^{12}$, $R^{13}$, $R^{14}$ are all same types. And, x, y, z denote copolymerization ratio, and n denotes a polymerization ratio.

As described above, according to the present invention, the luminous layer made of the polymer shown in the above chemical formula (11), (12), (19), (24), and (27) are formed between the lower electrode and the upper electrode respectively. In contrast to the polymer employed as the luminous Also, if the polymer is synthesized such that the substitution ratio of the para-product and the meta-product is set to x:y=2:1 in the chemical formula (10), the luminous layer that can provide the particularly strong emission can be obtained.

What is claimed is:
1. An organic light-emitting device comprising:
    a lower electrode;
    a luminous layer formed on the lower electrode and made of polymer indicated by (1)

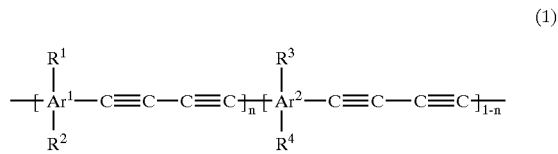

(1)

where $Ar^1$ denotes a first arylene group, $Ar^2$ denotes a second arylene group, $R^1$ denotes a first substituent, $R^2$ denotes a second substituent, $R^3$ denotes a third substituent, $R^4$ denotes a fourth substituent, and n denotes a copolymerization ratio;

and the first arylene group is a paraphenylene group and the $R^1$ the $R^2$ and $Ar^1$ consititute a para-product, and the second arylene group is a metaphenylene group and the $R^3$, the $R^4$ and the $Ar^2$ constitute a meta-product; and an upper electrode formed on the luminous layer.

2. An organic light-emitting device according to claim 1, wherein each of the first substituent, the second substituent, the third substituent, and the fourth substituent is any one of hydrogen atom, alkyl group, alkoxy group, carboxyl group, cyano group, phenyl group, biphenyl group, or cyclohexylphenyl group.

3. An organic light-emitting device according to claim 2, wherein all the first substituent, the second substituent, the third substituent, and the fourth substituent are a different kind, some of them are the same kind, or all of them are the same kind.

4. An organic light-emitting device according to claim 1, wherein the first arylene group of the polymer is a paraphenylene group and the second arylene group is metaphenylene group, and the polymer is given by (2).

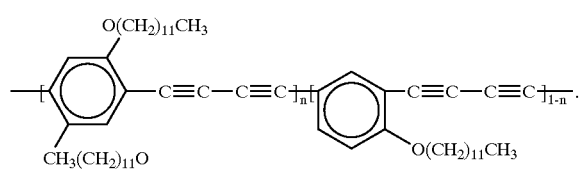

(2)

5. An organic light-emitting device according to claim 4, wherein the n is 0.66, or then is a value to satisfy n:(1−n)= 2:1.

6. An organic light-emitting device according to claim 1 or claim 4, wherein the n is 0<n≦0.9.

7. An organic light-emitting device according to claim 1, wherein one of the upper electrode and the lower electrode is formed of light transparent conductive material.

8. An organic light-emitting device according to claim 1, wherein one of the upper electrode or the lower electrode is formed of alkaline metal or alkaline earth metal, or contains such metal.

9. An organic luminous material give by (3)

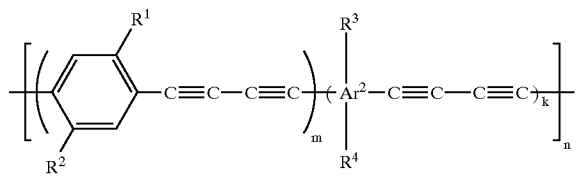

(3)

where $Ar^2$ denotes an arylene group, $R^1$ denotes a first substituent, $R^2$ denote a second substituent, $R^3$ denotes a third substituent, $R^4$ denotes a fourth substituent, and n denotes a copolymerization ratio, and an aromatic ring constituting the $Ar^2$ is any one of thiophene, anthracene, pyridine, phenol, aniline, and each derivative of them.

10. An organic luminous material according to claim 9, wherein the first substituent, the second substituent, the third substituent and the fourth substituent are any one of hydrogen atom, alkyl group, alkoxy group, carboxyl group, cyano group, phenyl group, biphenyl group, and cyclohexylphenyl group respectively.

11. An organic luminous material given by (5)

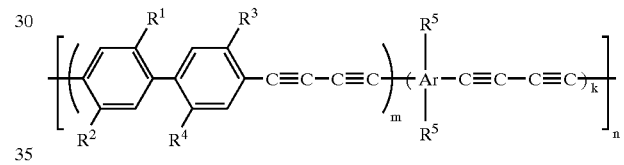

(5)

where Ar denotes an arylene group, $R^1$ denotes a first substituent, $R^2$ denotes a second substituent, $R^3$ denotes a third substituent, $R^4$ denotes a fourth substituent, $R^5$ denotes a fifth substituent, $R^6$ denotes a sixth substituent, m and k denote copolymerization ratio, and n denotes a polymerization ratio.

12. An organic luminous material according to claim 11, wherein an aromatic ring constituting the arylene group is any one of benzene, pyrrole, thiophene, carbozole, furan, fluorine, naphthalene, anthracene, and each derivative of them.

13. An organic luminous material according to claim 11, wherein the first, second, third, fourth, fifth, and sixth substituents are any one of hydrogen atom, alkyl group, alkoxy group, carboxyl group, cyano group, phenyl group, biphenyl group, and cyclohexylphenyl group respectively.

14. An organic luminous material given by (6)

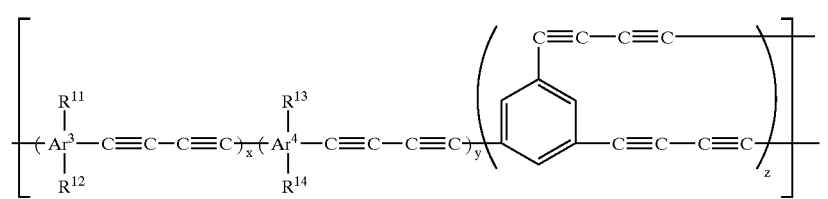

(6)

where $Ar^3$ denotes a first arylene group, $Ar^4$ denotes a second arylene group, $R^{11}$ denotes a first substituent, $R^{12}$ denotes a second substituent, $R^{13}$ denotes a third substituent, $R^{14}$ denotes a fourth substituent, x, y, z denote copolymerization ratio respectively, and n denotes a polymerization ratio.

15. An organic luminous material according to claim 14, wherein an aromatic ring constituting the first arylene group and the second arylene group is any one of benzene, pyrrole, thiophene, carbozole, furan, fluorine, naphthalene, anthracene, and each derivative of them.

16. An organic luminous material according to claim 14, wherein the first substituent, the second substituent, the third substituent, and the fourth substituent are any one of hydrogen atom, alkyl group, alkoxyl group, carboxyl group, cyano group, phenyl group, biphenyl group, and cyclohexylphenyl group respectively.

17. An organic light-emitting device in which the organic luminous material set forth in any one of claims 9, 11 or 14 is put between an upper electrode and a lower electrode.

18. An organic light-emitting device according to claim 1, wherein the copolymerization ratio, n of the first arylene group to the second arylene group is $n:(1-n)=2:1$ or $n=0.66$.

* * * * *